(12) United States Patent
Horng et al.

(10) Patent No.: US 8,609,262 B2
(45) Date of Patent: *Dec. 17, 2013

(54) STRUCTURE AND METHOD TO FABRICATE HIGH PERFORMANCE MTJ DEVICES FOR SPIN-TRANSFER TORQUE (STT)-RAM APPLICATION

(75) Inventors: Cheng T. Horng, San Jose, CA (US); Ru-Ying Tong, Los Gatos, CA (US); Guangli Liu, Pleasanton, CA (US); Robert Beach, Los Gatos, CA (US); Witold Kula, Sunnyvale, CA (US); Tai Min, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 381 days.

This patent is subject to a terminal disclaimer.

(21) Appl. No.: 12/460,412

(22) Filed: Jul. 17, 2009

(65) Prior Publication Data

US 2011/0014500 A1   Jan. 20, 2011

(51) Int. Cl.
| | | |
|---|---|---|
| *G11B 5/706* | (2006.01) | |
| *H01L 43/08* | (2006.01) | |
| *H01L 29/82* | (2006.01) | |
| *G01R 33/09* | (2006.01) | |
| *G11C 11/16* | (2006.01) | |

(52) U.S. Cl.
USPC ........ 428/811.1; 365/158; 365/171; 365/172; 365/173; 257/421; 257/295; 257/E21.665; 257/E21.001; 257/E29.323

(58) Field of Classification Search
None
See application file for complete search history.

(56) References Cited

U.S. PATENT DOCUMENTS

| | | | |
|---|---|---|---|
| 7,411,817 B2 | 8/2008 | Nozieres et al. | |
| 7,479,394 B2 | 1/2009 | Horng et al. | |
| 7,480,173 B2 | 1/2009 | Guo et al. | |
| 7,488,609 B1 | 2/2009 | Lin et al. | |
| 7,732,881 B2 * | 6/2010 | Wang | 257/421 |
| 8,470,462 B2 * | 6/2013 | Horng et al. | 428/811.1 |
| 2002/0009616 A1 * | 1/2002 | Kamiguchi et al. | 428/692 |
| 2006/0164764 A1 * | 7/2006 | Kamiguchi et al. | 360/324.1 |
| 2008/0180991 A1 | 7/2008 | Wang | |
| 2009/0027810 A1 * | 1/2009 | Horng et al. | 360/324.2 |
| 2009/0108383 A1 | 4/2009 | Horng et al. | |
| 2009/0218645 A1 * | 9/2009 | Ranjan et al. | 257/421 |
| 2010/0065935 A1 * | 3/2010 | Horng et al. | 257/421 |

OTHER PUBLICATIONS

IDS reference to Honda, S., Okada, T., Nawate, M., and Tokumoto, M., Phys. Rev. B., 56(12), 1997, 14-566 to 14-573.*

(Continued)

*Primary Examiner* — Kevin Bernatz
(74) *Attorney, Agent, or Firm* — Saile Ackerman LLC; Stephen B. Ackerman (57) ABSTRACT

A STT-RAM MTJ is disclosed with a MgO tunnel barrier formed by natural oxidation and containing an oxygen surfactant layer to form a more uniform MgO layer and lower breakdown distribution percent. A CoFeB/NCC/CoFeB composite free layer with a middle nanocurrent channel layer minimizes $Jc_0$ while enabling thermal stability, write voltage, read voltage, and Hc values that satisfy 64 Mb design requirements. The NCC layer has RM grains in an insulator matrix where R is Co, Fe, or Ni, and M is a metal such as Si or Al. NCC thickness is maintained around the minimum RM grain size to avoid RM granules not having sufficient diameter to bridge the distance between upper and lower CoFeB layers. A second NCC layer and third CoFeB layer may be included in the free layer or a second NCC layer may be inserted below the Ru capping layer.

16 Claims, 6 Drawing Sheets

(56) References Cited

OTHER PUBLICATIONS

IDS reference to Ikeda, S., Hayakawa, J., Lee, Y., Matsukura, F., Ohno, Y., Hanyu, T., and Ohno, H., IEEE Trans. Elec. Dev., 54(5), 2007, 991-1002.*

Co-pending US Patent HMG08-007, U.S. Appl. No. 12/284,066, filed Sep. 18, 2008, "Structure and Method to Fabricate High Performance MTJ Devices for Spin-Transfer Torque (STT)-RAM," assigned to the same assignee as the present invention.

"Current-driven excitation of magnetic multilayers," by J.C. Slonczewski, Journal of Magnetism and Magnetic Materials 159 (1996) L1-L7, Elsevier.

"Currents, torques, and polarization factors in magnetic tunnel junctions," by J.C Slonczewski, Physical Review B 71, 02411 (2005), pp. 1-10.

"A Novel Nonvolatile Memory with Spin Torque Transfer Magnetization Switching: Spin-RAM," M. Hosomi et al., 2005 IEDM, paper 19-1, 4 pages.

"2Mb Spin-Transfer Torque RAM (SPRAM) with Bit-by-Bit Bidirectional Current Write and Parallelizing-Direction Current Read," by T. Kawahara et al., 2007 IEEE International Solid State Circuits Conference, Session 26, Non-Volatile Memories, 26.5, pp. 480-481 and pp. 617.

"Excellent Scalability and Switching Characteristics in Spin-Torque MRAM," by S. C. Oh et al., IEDM 2006, 288.1.jpg, pp. 1-3.

"Tunneling giant Magnetoresistance in heterogeneous Fe-SiO2 granular films," Pysical Review B, vol. 56, No. 22, Dec. 1, 1997-II, pp. 14 566 to 14 573.

"Tunneling magnetoresistance in ultrathin Co-SiO2 granular films," by S. Honda et al., Journal of Applied Physics, vol. 93, No. 10, May 15, 2003, pp. 7936-7938.

"Magnetic Tunnel Junctions for Spintronic Memories and Beyond," by Shoji Ikeda et al., IEEE Transactions on Electron Devices, vol. 54, No. 5, May 5, 2007, pp. 991-1002.

"Magnetic Damping in Ferromagnetic Thin Films," by Mikihiko Oogane et al., Japanese Journal of Applied Physics, vol. 45, No. 5A, 2006, pp. 3889-3891.

"Enhanced Gilbert Damping in Thin Ferromagnetic Films," by Yaroslav Tserkovnyak et al., Physical Review Letters, vol. 88, No. 11, Mar. 18, 2002, pp. 117601-1 to 117601-4.

"230% room-temperature magnetoresistance in CoFeB/MgO/CoFeB magnetic tunnel junctions," by David D. Djayaprawira et al., Applied Physics Letters 86, 092502 (2005), pp. 1-3.

* cited by examiner

STRUCTURE AND METHOD TO FABRICATE HIGH PERFORMANCE MTJ DEVICES FOR SPIN-TRANSFER TORQUE (STT)-RAM APPLICATION

RELATED PATENT APPLICATIONS

This application is related to U.S. Pat. No. 8,138,561 which is assigned to a common assignee and is herein incorporated by reference in its entirety.

FIELD OF THE INVENTION

The invention relates to a high performance Magnetic Tunneling Junction (MTJ) element and a method for making the same, and in particular, to a spin transfer torque (STT-RAM) device that achieves low switching current and high dR/R by incorporating a free layer having a FL1/NCC/FL2 configuration in which the nano-conducting channels in the middle NCC layer magnetically and electrically couple the two portions FL1 and FL2 of the free layer.

BACKGROUND OF THE INVENTION

Magnetoresistive Random Access Memory (MRAM), based on the integration of silicon CMOS with MTJ technology, is a major emerging technology that is highly competitive with existing semiconductor memories such as SRAM, DRAM, and Flash. Similarly, spin-transfer (spin torque) magnetization switching described by C. Slonczewski in "Current driven excitation of magnetic multilayers", J. Magn. Magn. Mater. V 159, L1-L7 (1996), has recently stimulated considerable interest due to its potential application for spintronic devices such as STT-RAM on a gigabit scale.

Figure 1:
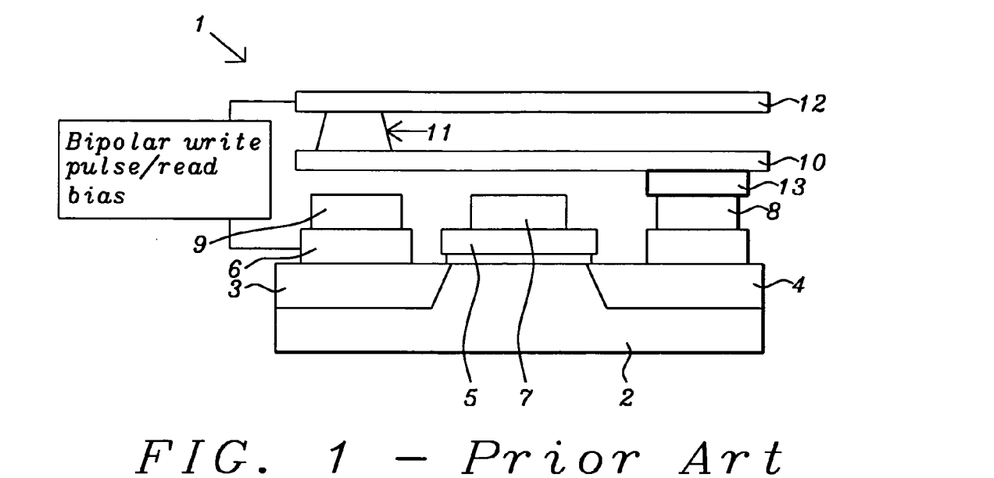
FIG. 1 is a cross-sectional view showing a memory cell in a conventional STT-RAM device.

As shown in FIG. 1, one embodiment of a memory cell in a STT-RAM 1 includes a gate 5 formed above a p-type semiconductor substrate 2, a source 3, drain 4, word line (WL) 7 above the gate, and a source line 9. There is also a bottom electrode (BE) 10 formed above the source line 9 and word line 7, and a MTJ cell 11 between the BE and bit line (BL) 12. There is a Cu stud 6 connecting the source 3 to BL 12, and a via 13 and Cu stud 8 to connect BE 10 to drain 4. Thus, the transistor source 3 and drain 4 are connected to the MTJ 11 so that DC current may flow across the MTJ.

Both field-MRAM and STT-RAM have a MTJ element based on a tunneling magneto-resistance (TMR) effect wherein a stack of layers has a configuration in which two ferromagnetic layers are separated by a thin non-magnetic dielectric layer. The MTJ element is typically formed between a bottom electrode such as a first conductive line and a top electrode which is a second conductive line at locations where the top electrode crosses over the bottom electrode. A MTJ stack of layers may have a bottom spin valve configuration in which a seed layer, an anti-ferromagnetic (AFM) pinning layer, a ferromagnetic "pinned" layer, a thin tunnel barrier layer, a ferromagnetic "free" layer, and a capping layer are sequentially formed on a bottom electrode. The AFM layer holds the magnetic moment of the pinned layer in a fixed direction. The pinned layer has a magnetic moment that is fixed in the "x" direction, for example, by exchange coupling with the adjacent AFM layer that is also magnetized in the "x" direction. The free layer has a magnetic moment that is either parallel or anti-parallel to the magnetic moment in the pinned layer. The tunnel barrier layer is thin enough that a current through it can be established by quantum mechanical tunneling of conduction electrons. The magnetic moment of the free layer may change in response to external magnetic fields and it is the relative orientation of the magnetic moments between the free and pinned layers that determines the tunneling current and therefore the resistance of the tunneling junction. When a sense current is passed from the top electrode to the bottom electrode in a direction perpendicular to the MTJ layers, a lower resistance is detected when the magnetization directions of the free and pinned layers are in a parallel state ("0" memory state) and a higher resistance is noted when they are in an anti-parallel state or "1" memory state.

In a read operation, the information stored in a field-MRAM cell is read by sensing the magnetic state (resistance level) of the MTJ element through a sense current flowing top to bottom through the cell in a current perpendicular to plane (CPP) configuration. During a write operation, information is written to the field-MRAM cell by changing the magnetic state in the free layer to an appropriate one by generating external magnetic fields as a result of applying bit line and word line currents in two crossing conductive lines, either above or below the MTJ element. One line (bit line) provides the field parallel to the easy axis of the bit while another line (digit line) provides the perpendicular (hard axis) component of the field. The intersection of the lines generates a peak field that is engineered to be just over the switching threshold of the MTJ.

A high performance MRAM MTJ element is characterized by a high tunneling magnetoresistive (TMR) ratio which is dR/R where R is the minimum resistance of the MTJ element and dR is the change in resistance observed by changing the magnetic state of the free layer. A high TMR ratio and resistance uniformity (Rp_cov), and a low switching field (Hc) and low magnetostriction ($\lambda_S$) value are desirable for conventional MRAM applications. For Spin-RAM (STT-RAM), a high $\lambda_S$ and high Hc leads to high anisotropy for greater thermal stability. This result is accomplished by (a) well controlled magnetization and switching of the free layer, (b) well controlled magnetization of a pinned layer that has a large exchange field and high thermal stability and, (c) integrity of the tunnel barrier layer. In order to achieve good barrier properties such as a specific junction resistance×area (RA) value and a high breakdown voltage (Vb), it is necessary to have a uniform tunnel barrier layer which is free of pinholes that is promoted by a smooth and densely packed growth in the AFM and pinned layers. RA should be relatively small (<10000 ohm-$\mu m^2$) for MTJs that have an area defined by an easy axis and hard axis dimensions of less than 1 micron.

As the size of MRAM cells decreases, the use of external magnetic fields generated by current carrying lines to switch the magnetic moment direction becomes problematic. One of the keys to manufacturability of ultra-high density MRAMs is to provide a robust magnetic switching margin by eliminating the half-select disturb issue. For this reason, a new type of device called a spin transfer (spin torque) device was developed. Compared with conventional MRAM, spin-transfer torque or STT-RAM has an advantage in avoiding the half select problem and writing disturbance between adjacent cells. The spin-transfer effect arises from the spin dependent electron transport properties of ferromagnetic-spacer-ferromagnetic multilayers. When a spin-polarized current transverses a magnetic multilayer in a CPP configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic layer if the current density is sufficiently high, and if the dimensions of the multilayer are small. The difference between a STT-RAM and a conventional MRAM is only in the write operation mechanism. The read mechanism is the same.

For STT-RAM to be viable in the 90 nm technology node and beyond, the ultra-small MTJs (also referred to as nanopillars or nanomagnets herein) must exhibit a TMR ratio that is much higher than in a conventional MRAM-MTJ which uses AlOx as the tunnel barrier and a NiFe free layer. Furthermore, the critical current density (Jc) must be lower than about $10^6$ A/cm$^2$ to be driven by a CMOS transistor that can typically deliver 100 μA per 100 nm gate width. A critical current for spin transfer switching (Ic), which is defined as [(Ic$^+$+Ic$^-$)/2], for the present 180 nm node sub-micron MTJ having a top-down area of about 0.2×0.4 micron, is generally a few milliamperes. The critical current density (Jc), for example (Ic/A), is on the order of several $10^7$ A/cm$^2$. This high current density, which is required to induce the spin-transfer effect, could destroy a thin tunnel barrier made of AlOx, MgOx, or the like. Thus, for high density devices such as STT-RAM on a gigabit scale, it is desirable to decrease Ic (and its Jc) by approximately an order of magnitude so as to avoid an electrical breakdown of the MTJ device and to be compatible with the underlying CMOS transistor that is used to provide switching current and to select a memory cell.

Once a certain MTJ cell has been written to, the circuits must be able to detect whether the MTJ is in a high or low resistance state which is called the "read" process. Uniformity of the TMR ratio and the absolute resistance of the MTJ cell are critical in field-MRAM (and STT-RAM) architecture since the absolute value of MTJ resistance is compared with a reference cell in a fixed resistance state during read mode. Needless to say, the read process introduces some statistical difficulties associated with the variation of resistances of MTJ cells within an array. If the active device resistances in a block of memory show a large resistance variation (i.e. high Rp_cov, Rap_cov), a signal error can occur when they are compared with a reference cell. In order to have a good read operation margin, TMR ratio/Rp_cov (or Rap_cov) should be greater than 12, preferably >15, and most preferably >20 where Rp is the MTJ resistance for free layer magnetization aligned parallel to pinned layer magnetization (which is fixed) and Rap is the resistance of free layer magnetization aligned anti-parallel to the pinned layer magnetization.

The intrinsic critical current density (Jc) as given by Slonczewski of IBM is shown in equation (1) below.

$$Jc = 2e\alpha Ms\, t_F(Ha + H_{k_\perp} + 2\pi Ms)/\hbar\, \eta \quad (1)$$

where e is the electron charge, α is a Gilbert damping constant, $t_F$ is the thickness of the free layer, $\hbar$ is the reduced Plank's constant, η is the spin-transfer efficiency which is related to the spin polarization (P), Ha is the external applied field, $H_k$ is the uniaxial anisotropy field, and 2 πMs is the demagnetization field of the free layer. Two publications by C. Slonczewski that relate to STT-RAM are entitled "Current driven excitation of magnetic multilayers", J. Magn. Magn. Mater. V 159, L1-L7 (1996), and "Current, torques, and polarization factors in magnetic tunnel junctions", Physical Review B 71, 024411(2005). In a MTJ structure (F/I/F) where F is a ferromagnetic layer and I is an insulator, when the spin relaxation distance is much larger than the ferromagnetic film thickness, the spin continuity holds true, i.e., the sum of interfacial torques from both left and right sides equals the net inflow of spin current. As the magnetization is fixed on one side, the other side magnetization will experience an in-plane torque of T=−($\hbar$ P$_L$J$_0$/2e)sin(θ) where e is the electron charge, P$_L$ is tunneling polarization parameter, J$_0$ is electric current density, and θ is the angle between the magnetizations on the two sides of the tunnel barrier (insulator).

Normally, the demagnetizing field, 2 πMs (several thousand Oe term) is much larger than the uniaxial anisotropy field Hk and external applied field (approximately 100 Oe) Ha term, hence the effect of Hk and Ha on Jc are small. In equation (2), V equals MS(t$_F$A) and is the magnetic volume which is related to the thermal stability function term K$_u$V/k$_b$T where K$_u$ is the magnetic anisotropy energy and k$_b$ is the Boltzmann constant.

$$Jc \propto \alpha Ms V/\hbar\, \eta \quad (2)$$

Another publication relating to a STT-RAM (Spin-RAM) structure is by M. Hosomi et al. in "A novel non-volatile memory with spin torque transfer magnetization switching: Spin-RAM", 2005 IEDM, paper 19-1, and describes a 4 Kbit Spin RAM having CoFeB pinned and free layers, and a RF-sputtered MgO tunnel barrier that was annealed under 350° C. and 10000 Oe conditions. The MTJ size is 100 nm×150 nm in an oval shape. The tunnel barrier is made of crystallized (001) MgO with a thickness controlled to <10 Angstroms for a proper RA of around 20 ohm-um$^2$. Intrinsic dR/R of the MTJ stack is 160% although dR/R for the 100 nm×150 nm bit during read operation (with 0.1 V bias) is about 90% to 100%. Using a 10 ns pulse width, the critical current density, Jc, for spin transfer magnetization switching is around 2.5×10$^6$ A/cm$^2$. Write voltage distribution on a 4 Kbit circuit for high resistance state to low resistance (P to AP) and low resistance state to high resistance state (AP to P) has shown good write margin. Resistance distribution for the low resistance state (Rp) and high resistance state (Rap) has a sigma (Rp_cov) of about 4%. Thus, for a read operation, TMR (with 0.1 V bias)/Rp_cov is >20.

T. Kawahara et al. in "2 Mb Spin-transfer torque RAM with bit-by-bit bi-directional current write and parallelizing-direction current read", 2007 IEEE International Solid State Circuits Conference, describe a prototype RAM with a CoFe(B)/RF-sputtered MgO/CoFe—NiFe MTJ. With an MgO tunnel barrier thickness of 10 Angstroms, the RA is around 20 ohm-μm$^2$. A TMR of ~100% is achieved when the annealing temperature is 350° C. Switching voltage for a 100 nm×50 nm oval MTJ using a 100 ns pulse is around 0.7 V and Jc is 2 to 3×10$^6$ A/cm$^2$. The switching was operated in a thermally assisted regime (100 ns write pulse).

In S. Oh et al. "Excellent scalability and switching characteristics in spin-transfer torque MRAM", IEDM 2006, conventional lithography and dry etching techniques are used to make sub-50 nm MTJ cell sizes and thereby achieve Gb density. Low switching current density (Jc) of 1.63×10$^6$ A/cm$^2$ with 10 ns pulse was realized through optimizing magnetic materials in a CoFeB/MgO/CoFeB MTJ structure.

S. Honda et al. in "Tunneling giant magnetoresistance in heterogeneous Fe—SiO$_2$ granular films", Phys. Rev. B, V56, p 14566 (1997), and in "Tunneling magnetoresistance in ultrathin Co—SiO$_2$ granular films", JAP, V93, p 7936 (2003), examined the thickness dependencies of magnetic and TMR properties in Fe—SiO$_2$ and Co—SiO$_2$ films. Because of the Fe—O or Fe(Si)—O shells surrounding Fe granules, the isolated Fe(FeSi) granule diameter for the sputtered Fe(40 at. %)-SiO$_2$ film is distributed between 10 and 25 Angstroms. In Co—SiO$_2$ granular films, the isolated Co granule diameter is on the same order as its thickness (i.e. columnar growth) because the formation of non-magnetic shells surrounding Co granules is fairly suppressed.

In U.S. Pat. No. 7,488,609, a first MgO tunnel barrier layer is formed over a ferromagnetic layer in a TMR device by DC magnetron sputtering from an Mg target in an oxygen environment. Then a second MgO layer is formed on the first MgO layer by sputter depositing a MgO layer in a non-oxygen environment.

The references above clearly indicate that spin-transfer-torque writing is a viable candidate for low power, high density non-volatile RAM. The prior art MTJ structures for STT-RAM typically use a CoFeB pinned layer, a RF sputter deposited MgO layer, and a CoFeB or CoFe/NiFe free layer. However, a lower switching current density (Jc) and a lower RA than obtained from RF sputtered MgO films are desired for optimum performance in advanced products including 64 Mb STT-RAM products. Furthermore, a low Jc value must be achieved simultaneously with acceptable values for read voltage (VR), write voltage (VW), Hc for storage, and thermal stability (Eb).

In previous disclosures from MagIC Technologies, natural oxidation (NOX) methods are described for forming a MgO tunnel barrier layer. U.S. Pat. No. 7,479,394 discloses a method involving the oxidation of a first Mg layer with a radical oxidation (ROX) step and then deposition of a second Mg layer which is subsequently oxidized by a NOX method. A third Mg layer may be formed as the top layer in the stack. In U.S. Patent Application 2009/0108383, a first Mg layer is oxidized by a NOX method and then a second Mg layer is formed on the MgO layer. U.S. Pat. No. 7,480,173 includes a MgO tunnel barrier layer with a thickness between 0.5 and 2 nm in a STT-MRAM.

In. U.S. Pat. No. 7,411,817, a MTJ is disclosed wherein a magnetic soft free layer is pinned by an AFM 1 layer (e.g. IrMn) which has a lower blocking temperature than the AFM 2 layer (e.g. MnPt) used to pin the pinned layer. During the write process, heating is induced in the MTJ to a temperature higher than the blocking temperature of AFM 1 but still lower than that of AFM 2 thereby allowing the free layer in the absence of AFM 1 pinning to be switched more easily.

SUMMARY OF THE INVENTION

One objective of the present invention is to provide a MTJ element that is able to satisfy design requirements for advanced devices including a 64 Mb STT-MRAM in which write voltage is <400 mV @ $10^{-9}$ error rate, read voltage is >100 mV @ $10^{-9}$ error rate, Hc>100 Oe for storage, and the thermal stability factor (Eb)>60.

A second objective of the present invention is to provide a MTJ according to the first objective that also has a (dR/R)/Rp_cov >15 and a $J_{Co}$ less than $2 \times 10^6$ A/cm$^2$.

According to one embodiment, these objectives are achieved by providing a substrate comprised of a bottom conductor electrode (BE) on which a spin-transfer (STT)-RAM structure is fabricated. The BE is typically a composite and preferably has an uppermost Ta layer that is sputter etched to form an amorphous surface to promote smooth and flat overlying layers in the MTJ. Thereafter, a MTJ stack of layers is deposited on the BE. In one aspect, the MTJ stack has a bottom spin valve configuration in which a seed layer, AFM layer, pinned layer, tunnel barrier layer, free layer, and a capping layer/hard mask layer are sequentially formed on the BE. The seed layer is preferably NiCr and the AFM layer may be comprised of MnPt or IrMn, for example. Preferably, the pinned layer has an AP2/Ru/AP1 configuration where the AP2 layer contacts the AFM layer and the AP1 layer contacts the tunnel barrier layer. The AP1 layer may be comprised of CoFe, CoFeB, or a combination thereof.

The tunnel barrier layer is preferably comprised of MgO made by a natural oxidation method in order to minimize the RA value. In one embodiment, a first Mg layer is sputter deposited on the AP1 layer followed by a NOX process to form a MgO layer. Thereafter, a second Mg layer, oxygen surfactant layer, and a third Mg layer are formed in succession on the MgO layer. A key feature in one embodiment is that the free layer is a composite comprised of a nanocurrent channel (NCC) layer formed between a lower magnetic FL1 layer contacting the tunnel barrier and an upper magnetic FL2 layer. In one aspect, the NCC layer has magnetic and electrically conductive RM grains formed in an insulator matrix represented by RMO, RMN, or RMON where R is Fe, Co, Ni, or an alloy thereof, and the metal (M) is Si, Al, or another element that is capable of forming oxides, nitrides, or oxynitrides. Preferably, the NCC layer thickness is essentially the same value in Angstroms as the minimum RM grain size. For example, the thickness of a FeSiO NCC layer is preferably about 10 Angstroms where R is Fe and M is Si, and the minimum Fe(Si) grain size is 10 Angstroms.

The FL1 and FL2 layers may be made of $Co_{20}Fe_{60}B_{20}$ in order to increase spin polarization and enable a lower switching current density ($J_{Co}$) than $Co_{40}Fe_{40}B_{20}$ or $Co_{60}Fe_{20}B_{20}$ free layers. Preferably, the FL1 layer is thicker than the FL2 layer. In one embodiment, a Ru/Ta capping layer is disposed on the FL2 layer. In addition, a hard mask may be employed on the capping layer. In a second embodiment, the capping layer may include a NCC layer as in a FeSiO/Ru configuration which is used to lower the damping constant of the FL2 layer in the composite free layer.

In yet another embodiment, the free layer may have a dual NCC configuration represented by FL1/NCC1/FL2/NCC2/FL3 in which the lower magnetic layer (FL1), middle magnetic layer (FL2), and upper magnetic layer (FL3) may all be comprised of CoFeB, CoFe, or a combination thereof. Furthermore, each NCC layer may be comprised of R(M) grains formed in an oxide, nitride, or oxynitride insulator matrix. Each NCC layer has a thickness less than or equal to the R(M) minimum grain size. The dual NCC configuration provides higher Bs and higher Hc_rem but increases $J_{Co}$ slightly compared with a single NCC free layer.

All of the layers in the MTJ stack may be formed by sputtering or ion beam deposition (IBD). Once all the layers in the MTJ stack are laid down, a thermal anneal process may be employed to fix the pinned layer magnetization (easy-axis) direction. The MTJ stack is patterned with a photolithography step to define a MTJ shape in a photoresist masking layer followed by a RIE process to transfer the MTJ shape through the MTJ stack and form a MTJ nanopillar (nanomagnet) having essentially vertical sidewalls that enable highly dense MTJ arrays necessary for Gbit STT-RAM devices.

DETAILED DESCRIPTION OF THE INVENTION

The present invention is a MTJ element (nanopillar) that provides low $J_{Co}$ and high thermal stability to enable enhanced performance necessary for advanced devices including 64 Mb STT-RAMs. The present invention also includes a method of forming a MTJ element for an ultra high density STT-RAM device. Although the exemplary embodiment depicts a bottom spin valve configuration, the present invention also encompasses a top spin valve design and dual spin valves as appreciated by those skilled in the art. A "top view" as described herein is defined as a viewpoint from a position above the plane of the substrate in the STT-RAM device. Note that the thicknesses for the magnetic layers and NCC layers in the free layer configuration described in various embodiments are based on a MagIC measurement scale and are thinner than determined by a HR-TEM (high resolution-transmission electron microscopy) measurement. In general, a conversion factor of 1.3 should be applied which means a 13.5 Angstrom ferromagnetic layer in the present invention is equivalent to about 18 Angstroms based on a HR-TEM measurement used in the industry. Thickness values for other layers are reported as measured by HR-TEM.

In a related U.S. Pat. No. 8,138,561, we disclosed a MTJ which in one embodiment comprises a $Co_{40}Fe_{40}B_{20}$/CoFe AP1 layer, a MgO tunnel barrier, and a $Co_{40}Fe_{40}B_{20}$/NCC/$Co_{40}Fe_{40}B_{20}$ free layer where NCC is FeSiO. Since the spin current passes only through the nano-conducting channels, a significant amount of Joule heating is produced that thermally assists writing of the free layer. $J_{c0}$ for a 100 nm×150 nm oval nanomagnet is $2.5 \times 10^6$ A/cm$^2$ and thermal stability measured by a conventional process is around 30. We were motivated to further improve MTJ structures based on spin transfer torque switching since existing technology does not meet all requirements for advanced devices such as 64 Mb STT-RAMs, 256 Mb SIT-RAMs, or even higher density devices. In particular, there is a need to realize all of the following features to enable an MTJ to be incorporated in a state of the art high areal density magnetic devices: write voltage <400 mV @ $10^{-9}$ error rate; read voltage >100 mV @ $10^{-9}$ error rate; Hc >100 Oe for storage; and thermal stability factor (Eb) >60. Moreover, TMR ratio/Rp_cov should be at least 15, and preferably ≥20, and it is desirable for $J_{c0}$ to be less than about $2 \times 10^6$ A/cm$^2$.

Figure 2:
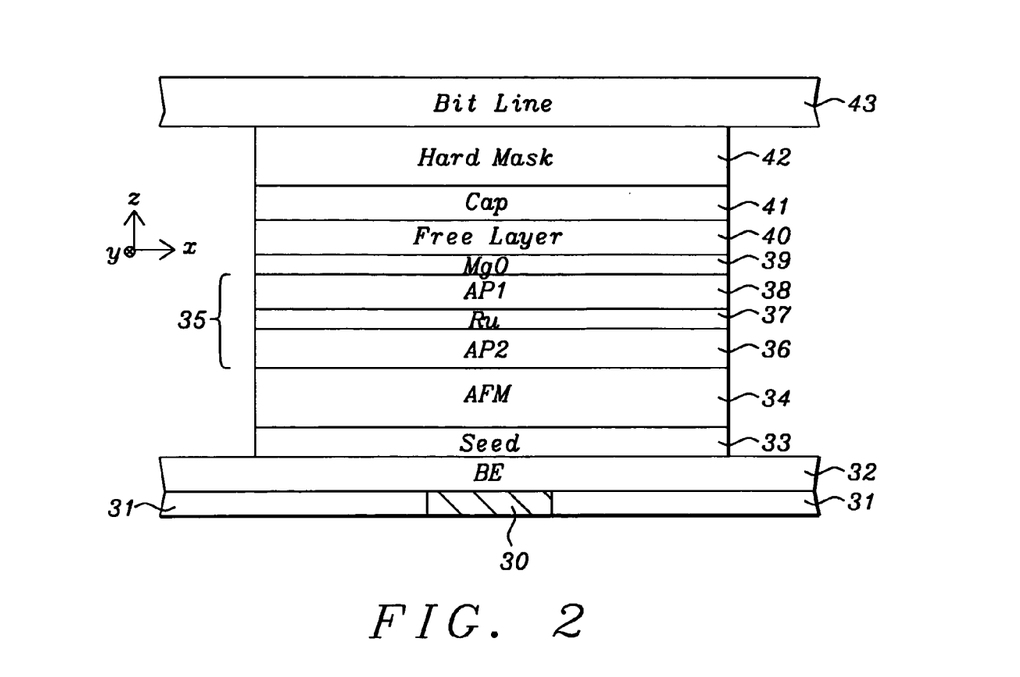
FIG. 2 is a cross-sectional view of a STT-RAM with a MTJ nanopillar formed according to an embodiment of the present invention.

Referring to FIG. 2, one embodiment of an MTJ according to the present invention is depicted. In particular, a MTJ comprised of layers 33-42 is formed between a bottom electrode 32 and a bit line 43 in a STT-RAM array (not shown). The bottom electrode 32 may be a composite layer comprised of a lower seed layer, middle conductive layer, and upper capping layer. In one embodiment, the bottom electrode 32 has a TaN/NiCr/Ru/Ta configuration in which the lower TaN layer (not shown) is formed on a substrate that may be an insulation layer 31 comprised of silicon oxide or the like and the uppermost Ta layer contacts the seed layer 33. The insulation layer 31 may have a metal stud 30 formed therein so that electrical contact can be established between bit line 43 and a word line (not shown) in a sub-structure below the substrate. In one example, the thicknesses of the TaN, NiCr, Ru, and Ta layers are 30, 30, 100, and 120 Angstroms, respectively. However, the thickness of the various bottom electrode layers may be adjusted higher or lower to optimize performance as appreciated by those skilled in the art.

In another embodiment, the bottom electrode 32 includes at least a Ta layer (not shown) that may be subjected to sputter etching or ion milling to form an amorphous surface. The present invention also anticipates that an oxygen surfactant layer (OSL) may be formed on the Ta surface of the bottom electrode according to a method we previously disclosed in U.S. Pat. No. 7,208,807 where a sputter etched Ta layer is exposed to an oxygen environment for a certain period of time.

Returning to the exemplary embodiment, an amorphous Ta top surface on bottom electrode 32 is especially advantageous in promoting a uniform and dense growth in subsequently formed MTJ layers. The most critical layers in the MTJ stack are the tunnel barrier 39 and free layer 40. The tunnel barrier 39 must be extremely uniform over the wafer since small variations in thickness will result in a large variation in the resistance and in the RA value. In one embodiment, the bottom electrode (BE) 32 is patterned to form an array of BE lines before depositing an OSL (not shown) on the BE. Then, an insulation layer (not shown) is deposited and planarized by a conventional method to become coplanar with bottom electrode 32 (or BE/OSL stack).

In the exemplary embodiment, the MTJ stack is fabricated on the patterned bottom electrode 32 by sequentially forming a seed layer 33, AFM layer 34, synthetic anti-ferromagnetic (SyAF) pinned layer 35, MgO tunnel barrier 39, free layer 40, capping layer 41, and hard mask layer 42. Seed layer 33 is preferably NiCr but may be comprised of NiFe, NiFeCr, or other suitable seed layer materials. When a NiCr seed layer is grown on an oxygen surfactant treated α-Ta surface in the bottom electrode 32, a smooth and dense (111) NiCr crystal orientation results which promotes smooth and densely packed growth in subsequently formed MTJ layers.

The AFM layer 34 is preferably comprised of MnPt with a thickness in the range of 120 to 200 Angstroms although an IrMn layer about 50 to 100 Angstroms thick or other materials such as NiMn, OsMn, RuMn, RhMn, PdMn, RuRhMn, or MnPtPd are also acceptable. SyAF pinned layer 35 may have a AP2/coupling/AP1 configuration to improve thermal stability of the MTJ and also reduce the interlayer coupling Hin (offset) field applied to the free layer. Preferably, the AP2 layer 36 is made of CoFe, the coupling layer 37 is Ru, and the AP1 layer 38 is comprised of CoFe, CoFeB, or a combination thereof such as CoFeB/CoFe. In one embodiment, a CoFeB/CoFe AP1 layer 38 is used in combination with an amorphous CoFeB free layer 40. In another embodiment, a CoFeB AP1 layer 38 is employed in combination with a crystalline CoFeB free layer 40. A crystalline CoFeB free layer may have a CoFeB/NCC/CoFeB configuration wherein the NCC (nano-conducting channel) layer may be substantially amorphous in character.

Figure 3:
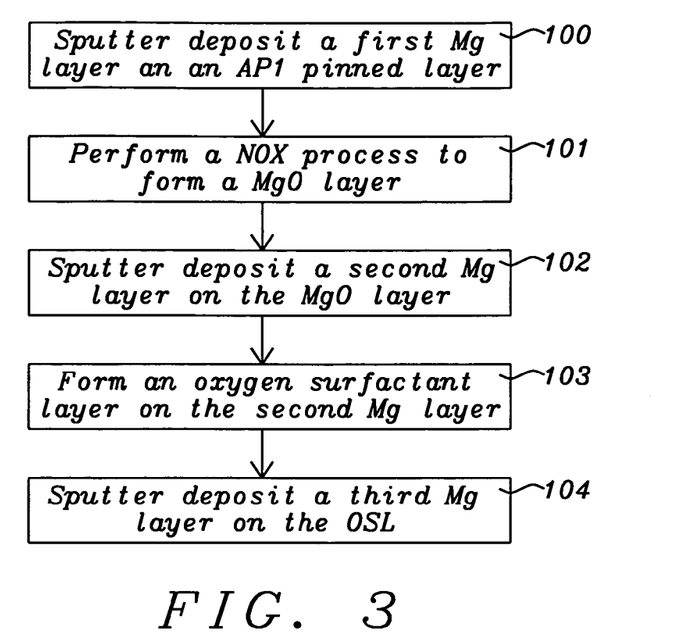
FIG. 3 is a flow chart showing the various steps involved in forming a MgO tunnel barrier according to one embodiment of the present invention.

A critical feature of the present invention is the process of forming the MgO tunnel barrier 39. In one embodiment, a sequence of steps used to fabricate MgO tunnel barrier layer 39 is illustrated in FIG. 3. We have found that inserting an oxygen surfactant layer in the MgO tunnel barrier provides an advantage over prior art MgO layers in that the undesirable soft breakdown (SBD) component of Vbd (breakdown voltage) is reduced. It should be understood that a Vbd distribution plot (not shown) generally has a bimodal distribution in which the "majority" mode is for devices showing "high" or normal Vbd and a "minority" mode for devices with a "lower" or softer Vbd (SBD). SBD is related to imperfections such as defects in the MgO barrier layer.

In the exemplary embodiment, MgO tunnel barrier formation comprises a first step 100 where a first Mg layer with a thickness from 5 to 8 Angstroms, and preferably 6 Angstroms thick, is DC-magnetron sputtered on an AP1 layer 38 followed by an in-situ natural oxidation (NOX) step 101 that may be performed in an oxidation chamber of a sputter deposition mainframe. Since the first Mg layer is thinner than employed in related U.S. Pat. No. 8,138,561 where the first Mg layer is about 8 Angstroms thick, a lower volume of oxygen is used during the NOX step. For example, if an 8 Angstrom thick Mg layer requires a 1 liter volume of oxygen for complete oxidation, then a 6 Angstrom thick Mg layer may need approximately 75% of the 1 L volume. Then a second Mg layer with a thickness in the range of 3 to 5 Angstroms, and preferably 3 Angstroms thick is sputter deposited on the oxidized first Mg layer during step 102. An oxygen surfactant layer (OSL) may be formed in step 103 by exposing the second Mg layer to a very low pressure oxygen atmosphere in an oxidation chamber within the sputter deposition mainframe. Optionally, the second Mg layer may be exposed to residual oxygen in a load lock chamber within a sputter deposition mainframe in order to form a thin OSL about 1 monolayer thick. Finally, in step 104 a third Mg layer with a thickness in the range of 2 to 4 Angstroms, and preferably 3 Angstroms thick, is sputter deposited on the OSL.

Our method involving a DC sputtering process with a metallic Mg target results in a uniform Mg film that is particulate free. The desired RA value for a STT-RAM MTJ in a 64 Mb design is less than about 8 ohm-μm² and can be achieved by adjusting Mg thickness and NOX process conditions. Typically, the NOX process comprises an oxygen flow rate of 0.1 to 1 standard liters per minute (slm) for a period of 30 to 500 seconds. The oxygen pressure is from 0.05 to 1 torr. It is believed that the oxygen in the MgO layer resulting from the NOX process diffuses into the second Mg layer to form a uniform MgO layer in which essentially all of the first and second Mg layers are oxidized. Moreover, the third Mg layer becomes oxidized due to contact with the OSL and by gettering oxygen from the free layer. It is important to remove oxygen from a magnetic free layer in order to maximize dR/R. Our results indicate that OSL insertion between the second and third Mg layers as described previously enables a more uniform MgO tunnel barrier 39 thereby lowering SBD.

It is known by those skilled in the art that a MTJ made from a crystalline (001) MgO tunnel barrier and a (001) CoFeB free layer is capable of delivering a very high dR/R that results from coherent tunneling in which electron symmetry of the ferromagnetic electrode is preserved in tunneling through the crystalline (001) MgO tunnel barrier. The most common CoFeB composition is represented by $[Co_xFe_{(100-x)}]_{80}B_{20}$ where the content of B is 20 atomic % and x is the atomic % of Co. The as-deposited CoFeB film has an amorphous phase structure and remains amorphous unless recrystallization occurs by annealing above 300° C. It should be understood that even though a CoFeB free layer has a somewhat higher intrinsic damping constant than a comparable CoFe free layer, a crystalline (001) CoFeB free layer resulting from annealing above 300° C. has a high polarization that leads to significantly higher dR/R than a CoFe free layer. Nevertheless, the present invention encompasses a free layer comprising either CoFe, CoFeB, or a combination thereof.

S. Ikeda et al. in "Magnetic tunnel junctions for spintronic memories and beyond", IEEE Trans. Electronic Dev., 54, 991 (2007), demonstrate that the TMR ratio for a MTJ containing a $Co_{20}Fe_{60}B_{20}/MgO/Co_{20}Fe_{60}B_{20}$ AP1/tunnel barrier/free layer configuration is as high as that for a $Co_{40}Fe_{40}B_{20}/MgO/Co_{40}Fe_{40}B_{20}$ MTJ which has the highest TMR ratio reported for MTJs having a MgO tunnel barrier layer. According to M. Oogane et al. in "Magnetic damping in ferromagnetic thin film", Jap JAP, 45, 3889 (2006), the damping constant for Fe-rich $Co_{20}Fe_{60}B_{20}$ is expected to be smaller than for $Co_{40}Fe_{40}B_{20}$.

In related U.S. Pat. No. 8,138,561, we disclosed that a lower switching current density $J_c$ was realized by lowering x from 75 to 50 in $[Co_xFe_{(100-x)}]_{80}B_{20}$ and employing a $Co_{40}Fe_{40}B_{20}$ alloy rather than a $Co_{60}Fe_{20}B_{20}$ alloy in the free layer of a STT-RAM MTJ since the former has a higher polarization and lower damping factor than a $Co_{60}Fe_{20}B_{20}$ alloy. According to equation (2) presented previously, a free layer having higher polarization and lower damping constant results in lower switching current density Jc. Furthermore, we have found that reducing x to the range of 20 to 30 atomic % in a CoFeB alloy provides an even lower $J_c$ than previously achieved. For example, a free layer 40 having a $Co_{20}Fe_{60}B_{20}/NCC/Co_{20}Fe_{60}B_{20}$ configuration where x=25 has a smaller $J_c$ than that of a $Co_{40}Fe_{40}B_{20}/NCC/Co_{40}Fe_{40}B_{20}$ free layer.

Figure 4:
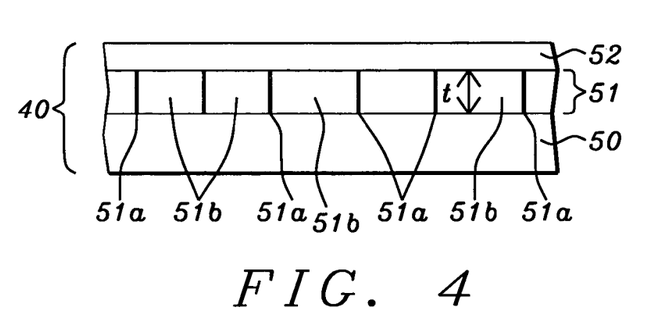
FIG. 4 is an enlarged cross-sectional view of the composite free layer in the MTJ nanopillar from FIG. 2 and depicts a nano-current channel layer formed therein.

Referring to FIG. 4, in one embodiment of the present invention, free layer 40 is preferably a composite that includes a lower (FL1) magnetic layer 50, an upper (FL2) magnetic layer 52, and a middle nanocurrent channel (NCC) layer 51 with a thickness t of 6 to 10 Angstroms that is essentially the same value in Angstroms as the minimum RM grain size in the RMO, RMN, or RMON NCC layer. The magnetic layers 50, 52 are preferably made of CoFeB having a low magnetic damping constant but also may be comprised of CoFe or a combination thereof such as CoFeB/CoFe. Upper magnetic layer 52 has a smaller thickness of about 4 to 12 Angstroms (5-16 Angstroms by HR-TEM measurement) compared with the lower magnetic layer 50 which has a thickness between 13 and 20 Angstroms (18-24 Angstroms by HR-TEM). Preferably, the lower (FL1) magnetic layer 50 has a thickness sufficiently large enough to form a continuous film which is believed to occur at approximately 13 Angstroms or slightly above that thickness value. However, raising FL1 thickness too high results in a higher $J_{CO}$. On the other hand, FL2 thickness is maintained below about 12 Angstroms to achieve a paramagnetic behavior in the absence of ferromagnetic coupling. It should be understood that FL1-FL2 coupling through the middle NCC layer 51 produces a ferromagnetic property in the FL2 layer 52. Thus, when the lower magnetic layer 50 is switched, the coupling will also result in FL2 layer 52 reversing its magnetic moment. As described in the examples in a later section, a greater FL2 thickness increases Bs and VR which is desirable, but unfortunately $J_{CO}$ also increases.

In an embodiment where the AP1 layer 38, FL1 layer 50, FL2 layer 52 are all comprised of CoFeB, the CoFeB composition such as $Co_{20}Fe_{60}B_{20}$ is preferably the same for each layer. We have also discovered an improvement in the CoFeB layer deposition method by employing a lower pressure and lower power than previously practiced. For example, the sputter deposition method may be modified to reduce the power from about 50 Watts to around 15 Watts and the Ar flow rate may be reduced from approximately 100 standard cubic centimeters per minute (sccm) to about 40 sccm. As a result, more uniform AP1, FL1, and FL2 layers are produced that improve magnetic properties of the MTJ.

Another important feature of the present invention is the middle NCC layer 51 made of RMO, RMN, or RMON where R is Fe, Co, Ni, or an alloy thereof such as CoFe, M is a metal such as Si or Al, and RM grains are formed as conductive channels in the metal (M) oxide, metal nitride, or metal oxynitride insulator matrix. In an embodiment where M is Si, RSiO, RSiN, and RSiON are composites in which conductive R(Si) grains such as Fe(Si) are magnetically and electrically coupled with the adjacent magnetic layers 50, 52, and are formed in an amorphous silicon oxide, silicon nitride, or silicon oxynitride insulator matrix. The R(Si) grains such as Fe(Si) are typically formed in columnar shapes that may extend from the lower magnetic layer 50 to the upper magnetic layer 52. The two magnetic layers 50, 52 are ferromagnetically coupled and therefore have a magnetic moment in the same direction. The magnetization direction of magnetic layers 50, 52 may either be aligned parallel or anti-parallel to the magnetization direction of AP1 reference layer 38. In another aspect, R is Co or Fe, and M is Al to produce a CoAlO or FeAlO NCC layer 51. In some cases, the combination of R and M is limited because a suitable RMO sputter deposition target cannot be manufactured. For example, current technology does not enable a suitable $Co-SiO_2$ target to be made. However, the present invention anticipates that an RMO layer may also be formed by co-sputtering R and MO targets.

In the exemplary embodiment that has a CoFeB/FeSiO/CoFeB free layer 40 configuration and a Ru capping layer 41, the spin current in the FeSiO portion of the free layer passes only through the nano-conducting channels 51a within a silicon oxide matrix 51b. As a result, there is high current density about 9-fold greater than in typical free layers comprised of CoFeB with no NCC layer which will cause reverse domain nucleation in which the domain wall will be pushed out by the continuous injection current in the STT-RAM until the entire free layer switches. Thermal heating caused by local current density may also contribute to magnetization switching in the two CoFeB layers. Because of the existence of reverse magnetization grains in the NCC layer and their coupling to the FL1, FL2 layers, the magnetization switching of the magnetic layers 50, 52 will be much easier than when a NCC layer is not present in the MTJ. In effect, the single spin valve (MTJ) described herein behaves like a dual spin valve (DSF) but without a reduction in dR/R in that the spin polarized current is reflected back from a free layer/cap layer interface and accumulates in the free layer. The enhancement of the transverse spin accumulation increases the spin torque and therefore effectively reduces the switching current.

In an embodiment where the NCC layer 51 is FeSiO (also shown as $FeSiO_2$), deposition is typically accomplished by RF-magnetron sputtering from a Fe(25 atomic %)-$SiO_2$ single target to provide a NCC thickness from 6 to 15 Angstroms, and preferably 8 to 10 Angstroms. According to S. Honda et al. in "Tunneling giant magnetoresistance in heterogeneous Fe—$SiO_2$ granular films", Phys. Rev. B. V56, p 14566 (1997), the volume fraction (x) of the Fe(Si) granules in the $SiO_2$ matrix is calculated to be 0.115. The isolated Fe(Si) granules were found to have a diameter ranging from 10 to 20 Angstroms.

We have set the lower limit of granule diameter distribution (10 Angstroms) as our process of record (POR) NCC layer 51 thickness in order to ensure uniformity in the NCC channels 51a between the two magnetic layers 50, 52. When the NCC thickness is greater than about 10 Angstroms, then some of the Fe(Si) granules fail to function as nano-current channels which leads to a high resistance in NCC layer 51 thereby increasing RA and Rp_cov of the MTJ which includes composite free layer 40. Note that a NCC layer 51 denoted herein as FeSiO8 (or NCC8) based on a MagIC scale, for example, has a real thickness of 10 Angstroms (about 1.3× greater) as calibrated by a HR-TEM instrument. If the NCC thickness is too small, then the FL1-FL2 coupling is too large which degrades performance. High resolution transmission electron microscopy (HR-TEM) indicates a NCC layer 51 is grown as a continuous film that is flat and smooth similar to MgO tunnel barrier layer 39. Note that other RMO, RMN, or RMON layers may have an optimum thickness different than 10 Angstroms depending on the minimum grain size in the RM size distribution.

Figure 5:
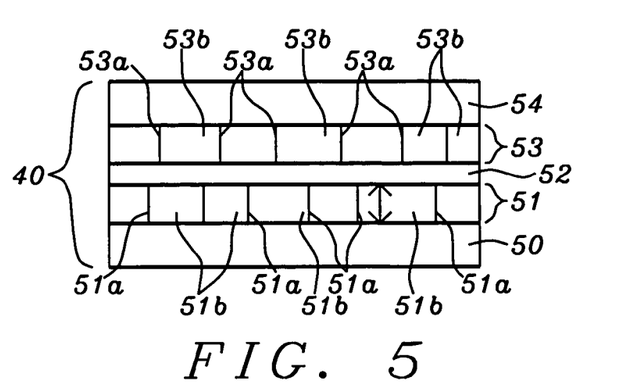
FIG. 5 is an enlarged cross-sectional view of a composite free layer in the MTJ from FIG. 2 that has a dual NCC configuration according to another embodiment of the present invention.

Referring to FIG. 5, another embodiment of the present invention is depicted that may be referred to as a dual NCC free layer. In particular, the dual NCC free layer 40 configuration comprises the NCC free layer structure shown in FIG. 4 and an additional second NCC layer 53 and third magnetic layer 54 sequentially formed on magnetic layer 52. In the exemplary embodiment, each of the NCC layers 51, 53 has a thickness from 6 to 7 Angstroms, and preferably 6 Angstroms. The dual NCC configuration has an overall larger NCC thickness than a single NCC layer in that the total NCC layer thickness (NCC 51+NCC 53) is greater than for a single NCC layer 51 which is typically around 8 Angstroms. Note that NCC layer 53 may be comprised of the same R(M) grains formed in a metal (M) oxide, nitride, or oxynitride insulator matrix previously described with respect to NCC layer 51. Thus, more heat is generated in the granular R(M) columns 51a, 53a for thermally assisting a switch in free layer 40 magnetization than by R(M) columns 51a only. In the dual NCC free layer configuration of this embodiment, the lower magnetic layer 50 has a thickness from 13 to 20 Angstroms, magnetic layer 52 has a thickness between 4 and 5 Angstroms, and the upper magnetic layer 54 is from 4 to 12 Angstroms thick. Preferably, all of the magnetic layers 50, 52, 54 have a composition represented by $[Co_xFe_{(1-x)}]_{80}B_{20}$ where x is between 10 and 30. Optionally, one or more of the magnetic layers may be comprised of CoFe, or a combination of CoFe and CoFeB.

Above the free layer 40 is a cap layer 41 that may be comprised of Ru having a thickness of 10 to 30 Angstroms, and preferably 30 Angstroms. In another embodiment, one or more other metals such as Ta may be employed as a capping layer either as a single layer, an alloy layer, a composite layer comprised of a stack of two or more metal layers, or in combination with Ru. A thin Ru capping layer 41 not only enhances dR/R but also considerably lowers the critical current $J_{C0}$. A substantial reduction in Jc is believed to result primarily because the Ru layer serves as a strong spin scatterer for the majority electrons which leads to an enhanced spin accumulation at the FL2 layer 52/capping layer 41 interface in a single NCC free layer configuration and at the FL3 layer 54/capping layer 41 interface in a dual NCC free layer configuration. The enhanced spin accumulation will increase the polarized current inside the free layer and thus produce an additional spin torque to act on the FL2 layer magnetization.

Figure 6:
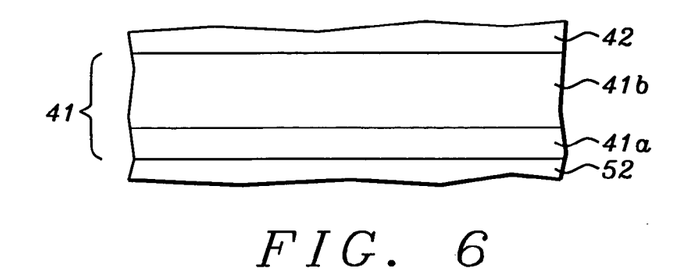
FIG. 6 is an enlarged cross-sectional view of a portion of a composite capping layer in a MTJ nanopillar according to one embodiment of the present invention.

In an alternative embodiment illustrated in FIG. 6 that involves a single NCC free layer, the cap layer 41 is a composite comprised of a lower RMO, RMN, or RMON NCC layer 41a about 5 to 6 Angstroms thick which contacts FL2 layer 52, and an upper Ru layer 41b. A Ru capping layer can cause a sizable enhancement of the damping constant in an adjacent CoFeB free layer as presented by Y. Tserkovnyak et al. in "Enhanced Gilbert damping in thin ferromagnetic films", Phys. Rev. Lett., V 88, p 116601 (2002). Because of the relationship expressed in equation (2) mentioned previously, it is advantageous to modify the free layer/cap structure so as to reduce the damping parameter of the upper FL2 layer 52 in free layer 40, especially when FL2 is comprised of CoFeB, and thereby reduce the intrinsic critical current density (Jc) to a desirable value. We have discovered that by reducing the NCC layer 51 thickness to 6 to 7 Angstroms and inserting a NCC layer 41a made of RMO, RMN, or RMON such as FeSiO with a thickness of about 5 to 6 Angstroms as the lower layer in capping layer 41, the damping parameter of an upper FL2 CoFeB layer 52 is effectively lowered.

Figure 7:
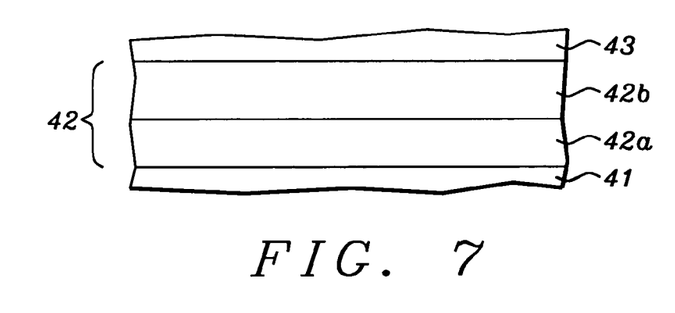
FIG. 7 is an enlarged cross-sectional view of a portion of a composite hard mask in a MTJ nanopillar according to an embodiment of the present invention.

Referring to FIG. 7, hard mask layer 42 may be a composite comprised of a lower MnPt layer 42a that contacts capping layer 41 and an upper Ta layer 42b on the MnPt layer. The MnPt/Ta configuration is designed especially for RIE processes used to pattern the MTJ nanopillars of this invention. Optionally, for ion beam etching (IBE) processes, alternative hard masks may be employed. According to a preferred embodiment, Ta layer 42b thickness is from 300 to 500 Angstroms, and preferably 300 Angstroms, while MnPt layer 42a thickness is from 200 to 300 Angstroms, and preferably 250 Angstroms. The MnPt layer 42a is employed to avoid using a 600 Angstrom thick Ta hard mask which would require a thicker photoresist layer (lower pattern resolution) during the hard mask patterning process. In an alternative embodiment, the hard mask 42 may be comprised of MnPt only.

The bottom electrode layer 32 and MTJ layers 33-42 may be sequentially formed on a substrate that is an insulation layer 31 made of silicon oxide, alumina, or the like and comprising a via stud 30. It should be understood that the via stud 30 is connected to a transistor drain (not shown) in an underlying sub-structure. The transistor is typically used in a write or read process that determines the resistance state of the bit cell (MTJ) once the MTJ stack of layers is patterned to form a MTJ nanopillar structure and a bit line is formed on the MTJ nanopillar. Note that unlike conventional MRAM, magnetization switching in a STT-RAM MTJ is accomplished by passing current through a bit cell and not by fields induced by current in a word line and a bit line. The bottom electrode 32 may have an area size in the "x, y" plane greater than that of overlying MTJ layers 33-42.

The MTJ stack comprised of layers 33-42 may be formed in the same process tool as the bottom electrode layer 32. For instance, the bottom electrode 32 and MTJ stack may be formed in an Anelva C-7100 thin film sputtering system or the like which typically includes three physical vapor deposition (PVD) chambers each having five targets, an oxidation chamber, and a sputter etching chamber. At least one of the PVD chambers is capable of co-sputtering. Usually, the sputter deposition process involves an argon sputter gas and the targets are made of metal or alloys to be deposited on a substrate. The bottom electrode layer 32 and overlying MTJ layers 33-42 may be formed after a single pump down of the sputter system to enhance throughput. The NOX process and OSL process used to form the MgO barrier layer 39 is typically performed in an oxidation chamber within the sputter deposition tool.

Once the MTJ stack of layers 33-42 is laid down on the patterned BE 32, a high temperature annealing may be performed. For example, MTJ layers 33-42 may be annealed in a vacuum by applying a magnetic field of 5000 to 10000 Oe in magnitude along the x-axis (easy axis) for 1 to 5 hours at a temperature of about 330° C. to 360° C.

Thereafter, an array of MTJ elements with essentially vertical sidewalls may be fabricated by a process involving a RIE process as mentioned previously. First, a photoresist layer (not shown) is coated on the hard mask 42 and then patterned by a conventional photolithography process. A pattern of islands is formed in the photoresist layer wherein each island corresponds to the desired ellipse shape or another shape of the MTJ nanopillar from a top view. The patterned photoresist layer then functions as an etch mask during a first reactive ion etch (RIE) process in a RIE system mainframe which removes uncovered regions of the Ta hard mask layer 42b. The photoresist layer may be stripped and a second RIE process is employed to selectively etch through regions of MnPt hard mask layer 42a, capping layer 41, and underlying MTJ layers 33-40 that are not protected by hard mask 42b. As a result, the pattern of islands initially formed in the photoresist layer is transferred through the MTJ stack of layers to form an array of MTJ nanopillars. Since a RIE process is used to generate essentially vertical sidewalls in the MTJ nanopillars, a more dense array of MTJs is possible than when an ion beam etch (IBE) is employed as in the prior art.

Alternatively, when MnPt is selected as the hard mask, a photoresist pattern is transferred through the MnPt layer with a single RIE process. Then a second RIE process is used to transfer the pattern in the hard mask layer 42 through the underlying MTJ stack of layers.

Figure 8:
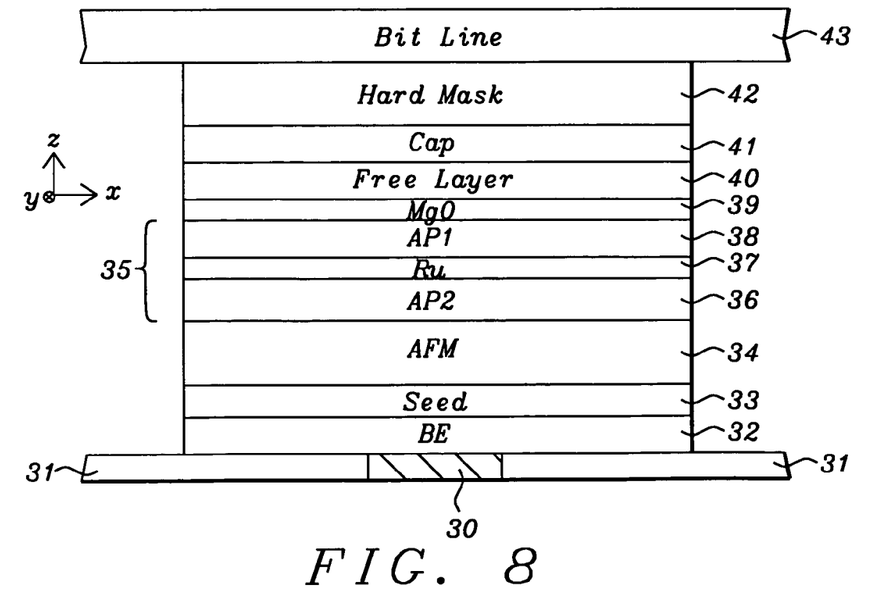
FIG. 8 is a cross-sectional view of a STT-RAM with a MTJ nanopillar formed according to a second embodiment of the present invention.

Referring to FIG. 8, the present invention anticipates an additional embodiment wherein the BE layer is not patterned before the MTJ stack of layers is deposited. Instead, the second etch process described above is extended so that the etch continues through the BE layer and forms a BE 32 having essentially the same shape from a top view as the overlying MTJ nanopillar. This embodiment allows a greater MTJ nanopillar density in the STT-RAM array than in the previous embodiment (FIG. 2). In this embodiment, a via stud (not shown) preferably contacts the lower surface of BE 32.

In both embodiments, following formation of an array of MTJ nanopillars, a second insulation layer (not shown) may be deposited on the BE 32 and/or substrate 31 to a level that fills in the spaces between adjacent MTJ nanopillars. A CMP process is used to remove an upper portion of the second insulation layer and thereby expose the hard mask layer 42. Thus, the second insulation layer becomes coplanar with the hard mask layer. Then a conductive material such as Cu, Al, or alloys thereof may be deposited on the second insulation layer and over the hard mask 42. Next, a bit line 43 that contacts the hard mask 42 is delineated by patterning the conductive layer using a well known photoresist patterning and etching sequence.

To evaluate the magnetic performance properties of MTJs fabricated according to the present invention, an Arachne 4 Kb ADM (array development macro) chip was employed as the test vehicle. In particular, nanomagnets (MTJs) having a 55 nm×210 nm (oval) size from a top-down view were built and tested. First, a 4 Kb nanomagnet was fabricated using a design and method previously practiced by the inventors as described in related patent application Ser. No. 12/284,066. Test results for an MTJ having a $Co_{40}Fe_{40}B_{20}$/(001)MgO/$Co_{40}Fe_{40}B_{20}$14/NCC/$Co_{40}Fe_{40}B_{20}$6/Ru30 AP1/tunnel barrier/free layer/cap configuration where NCC is a 10 Angstroms thick FeSiO layer and the Ru capping layer is 30 Angstroms thick are shown in Table 1. The MTJ stack is formed on a NiCr45/Ru200/Ta150 bottom electrode. The MgO layer was formed by first depositing an 8 Angstrom thick Mg layer followed by in-situ oxidation (NOX with 1 torr, 1 slm $O_2$ for 100 seconds) and then sputter deposition of a 4 Angstrom thick Mg layer on the resulting MgO layer. Annealing was performed for 1 hour (10K Oe) at 330° C. After wafer annealing, the (001) MgO layer is about 10 Angstroms thick. The value of the critical switching current density $J_{CO}^{P-AP}$, $J_{CO}^{AP-P}$, according to the equation $J_C(\tau)=J_{C0}[1-K_BT/K_UV \ln(\tau/\tau_0)]$ was obtained by extrapolating the switching current density $J_C^{+,-}$ at 30 ms, 3 ms, and 300 βs to a pulse of $\tau_0=1$ ns where $\tau_0$32 1 ns is the attempted frequency of thermal agitation. $K_u$ is the magnetic anisotropy energy, V is the free layer volume, and $k_B$ is the Bolzmann constant in the above equation.

TABLE 1

Magnetic Properties of MTJ with BE/NiCr45/MnPt150/$Co_{75}Fe_{25}$23/
Ru7.5/$Co_{40}Fe_{40}B_{20}$21/Mg8(NOX)Mg4/$Co_{40}Fe_{40}B_{20}$14/$FeSiO_2$10/
$Co_{40}Fe_{40}B_{20}$6/Ru30 configuration

| Bs | RA | dR/R | Rp_cov | Vb (mV) | SBD % | Hc (Oe) | $J_{CO}$, A/cm² | VW (mV) | VR (mV) | Eb |
|---|---|---|---|---|---|---|---|---|---|---|
| 0.6 | 7.8 | 80 | 5.7 | 850 | 3-4 | 110-120 | 2.5 × 10⁶ | 650 | 150 | 30 |

Note that the parameters listed in Table 1 are the median values for the 4 Kbit array. We observed a VW=650 mV for the MTJ (RA=7.8) which is much higher than the design point of <400 mV @ $10^{-9}$ error rate. In addition, SBD percent of 3-4% is too high to be useful for high areal density products. A high SBD as explained earlier means there are imperfections in the MgO layer. On the other hand, the damping constant of the $Co_{40}Fe_{40}B_{20}$14/$FeSiO_2$10/$Co_{40}Fe_{40}B_{20}$6 FL1/NCC/FL2 free layer is 0.001 vs. 0.002 for a single $Co_{40}Fe_{40}B_{20}$ free layer.

In another experiment, an MTJ formed according to an embodiment of the present invention was evaluated to determine performance enhancements over previous MTJ configurations. In this case, the MgO layer was formed by depositing a first Mg layer 6 Angstroms thick, performing a NOX (II) process (0.1 torr, 30 sccm $O_2$ for 100 seconds), depositing a second Mg layer 3 Angstroms thick, forming an OSL, and then depositing a third Mg layer on the OSL. Furthermore, the composition of the AP1, FL1, and FL2 layers was changed to $Co_{20}Fe_{60}B_{20}$ to enable a lower $J_{CO}$. Otherwise, the remaining MTJ layers and thicknesses are the same as described with respect to Table 1. The annealing process comprised 330° C. for 1 hour with a 10000 Oe applied field.

TABLE 2

Magnetic Properties of MTJ with BE/NiCr45/MnPt150/Co$_{75}$Fe$_{25}$23/
Ru7.5/Co$_{20}$Fe$_{60}$B$_{20}$21/Mg6-NOX(II)-Mg3/OSL/Mg3/Co$_{20}$Fe$_{60}$B$_{20}$13.5/
FeSiO$_2$10/Co$_{20}$Fe$_{60}$B$_{20}$5.5/Ru30 configuration

| Bs | RA | dR/R | Rp_cov | Vb (mV) | SBD % | Hc (Oe) | J$_{C0}$, A/cm$^2$ | VW (mV) | VR (mV) | Eb |
|---|---|---|---|---|---|---|---|---|---|---|
| 0.6 | 7.0 | 80 | 4.9 | 880 | 0.4 | 17.5 | 1.2 × 10$^6$ | 351 | 87 | 30 |

In order to achieve a Bs=0.6, a free layer having a Co$_{20}$Fe$_{60}$B$_{20}$13.5/FeSiO$_2$10/Co$_{20}$Fe$_{60}$B$_{20}$5.5 configuration was initially tested. The RA target in the example shown in Table 2 is 8 ohm-um$^2$. For an equivalent RA, SBD per cent has been reduced by an order of magnitude compared with the result in Table 1 by implementing a new method of forming the MgO tunnel barrier layer according to an embodiment described herein. Also, J$_{C0}$ has been significantly reduced to 1.2×10$^6$ A/cm$^2$ in Table 2. However, Hc=17.5 Oe is unexpectedly low. It should be understood that a higher Hc is desired in order to provide sufficient thermal stability in the device. Although VW=351 mV is meeting the 64 Mb design point, VR=87 mV is lower than the requirement.

To improve Hc and VR, the effect of FL1 and FL2 thickness on MTJ magnetic properties was studied. Results shown in Table 3 indicate how keeping the overall free layer thickness essentially constant but incrementally decreasing FL1 while increasing FL2 affects the magnetic properties. NCC (FeSiO$_2$) thickness is maintained at a constant 10 Angstroms. All other MTJ layers are kept the same as listed in Table 2.

TABLE 3

Magnetic Properties of MTJs with BE/NiCr45/MnPt150/Co$_{75}$Fe$_{25}$23/Ru7.5/
Co$_{20}$Fe$_{60}$B$_{20}$21/Mg6-NOX(II)Mg3/OSL/Mg3/FL1/FeSiO$_2$10/FL2/Ru30 configuration

| Free layer (FL1, FL2 = Co$_{20}$Fe$_{60}$B$_{20}$) | Bs | RA | dR/R | Rp_cov | Hc (Oe) | J$_{C0}$, A/cm$^2$ | VW (mV) | VR (mV) |
|---|---|---|---|---|---|---|---|---|
| FL1 13/NCC10/FL2 10 | 0.65 | 8.9 | 78 | 5.4 | 60 | 1.2 × 10$^6$ | 435 | 140 |
| FL1 15/NCC10/FL2 6 | 0.65 | 6.7 | 79 | 5 | 30 | 1.4 × 10$^6$ | 440 | 144 |
| FL1 16/NCC10/FL2 5.5 | 0.7 | 6.9 | 76 | 4.8 | 67 | 1.6 × 10$^6$ | 450 | 125 |
| FL1 18/NCC10/FL2 3 | 0.75 | 6.6 | 80 | 5.1 | 107 | 2.0 × 10$^6$ | 500 | 143 |

Note that RA=8.9 for the MTJ with a Co$_{20}$Fe$_{60}$B$_{20}$13/FeSiO$_2$10/Co$_{20}$Fe$_{60}$B$_{20}$10 free layer is drastically increased over that for the MTJ represented in Table 2 where FL1=13.5 and FL2=5.5. Previously, we had discovered that an MTJ made with a Co$_{40}$Fe$_{40}$B$_{20}$ FL1 free layer having a thickness of 12.5 Angstroms or less is paramagnetic which indicates the FL1 layer is a granular film. Evidently, a 13 Angstrom thick FL1 layer (top row of Table 3) is still not thick enough to form a continuous film and thereby yields a higher RA.

Based on the aforementioned experimental results, we conclude that (1) Hc derived from a B-H hysteresis plot (i.e. Hc_at field) is due to a spin-transfer effect, (2) Hc, J$_{C0}$, and VW in spin torque magnetization switching is controlled dominantly by the FL1 layer which in this case is CoFeB, (3) the magnitude of Hc, J$_{C0}$, and VW is proportional to FL1 thickness, and (4) for data storage retention, Hc_remnant rather than Hc_at field should be used. Hc_remnant is measured as follows: for the P (AP) state, (a) apply high H field to initialize free layer magnetization into the AP (P) state; (b) remove the H field so that the AP (P) magnetization is at the remnant state; and then (c) apply the field in the opposite direction and observe at what field the magnetization is switched to the P (AP) state. The switching field is Hc_(rem).

TABLE 4

Magnetic Properties of MTJs with BE/NiCr45/MnPt150/Co$_{75}$Fe$_{25}$23/Ru7.5/Co$_{20}$Fe$_{60}$B$_{20}$21/
Mg6-NOX(II)Mg3/OSL/Mg3/FL1/FeSiO$_2$10/FL2Ru30 configuration.

| Free layer (FL1, FL2 = Co$_{20}$Fe$_{60}$B$_{20}$) | Bs | RA | dR/R | Rp_cov | Hc_at field (Oe) | Hc_rem (Oe) | J$_{C0}$, A/cm$^2$ | VW (mV) | VR (mV) |
|---|---|---|---|---|---|---|---|---|---|
| FL1 13/NCC/FL2 10 | 0.65 | 8.9 | 78 | 5.4 | 60 | 70 | 1.2 × 10$^6$ | 435 | 140 |
| FL1 13.5/NCC/FL2 5.5 | 0.6 | 7.5 | 80 | 4.9 | 17.5 | 103 | 1.2 × 10$^6$ | 351 | 87 |
| FL1 15/NCC/FL2 6 | 0.65 | 6.7 | 79 | 5 | 30 | 120 | 1.4 × 10$^6$ | 440 | 144 |

TABLE 4-continued

Magnetic Properties of MTJs with BE/NiCr45/MnPt150/Co$_{75}$Fe$_{25}$23/Ru7.5/Co$_{20}$Fe$_{60}$B$_{20}$21/
Mg6-NOX(II)Mg3/OSL/Mg3/FL1/FeSiO$_2$10/FL2Ru30 configuration.

| Free layer (FL1, FL2 = Co$_{20}$Fe$_{60}$B$_{20}$) | Bs | RA | dR/R | Rp_cov | Hc_at field (Oe) | Hc_rem (Oe) | J$_{C0}$, A/cm$^2$ | VW (mV) | VR (mV) |
|---|---|---|---|---|---|---|---|---|---|
| FL1 18/NCC/FL2 3 | 0.75 | 6.6 | 80 | 5.1 | 107 | 125 | 2.0 × 10$^6$ | 500 | 143 |
| FL1 18/NCC/FL2 3 | 0.75 | 4.9 | 79 | 5.1 | 91 | 145 | 2.2 × 10$^6$ | 414 | 134 |

Table 4 shows the Hc_rem results from the Arachne wafers listed in Tables 2-3. For the MTJ in row 1, Hc_rem=70 Oe is still less than the 100 Oe design point. In row 2, the Co$_{20}$Fe$_{60}$B$_{20}$13.5/FeSiO$_2$10/Co$_{20}$Fe$_{60}$B$_{20}$5.5 MTJ has Hc_rem>100 Oe, VW<400 mV but VR=87 mV is still below the design point. By increasing the Bs to 0.65 (row 3) with thicker FL1, VR is greatly improved. However, J$_{C0}$ is also increased slightly. The bottom two rows represent the same free layer composition but the MgO layer was formed using slightly different NOX conditions to arrive at different RA values.

Since Hc_rem, VW, and J$_{C0}$ parameters are regulated dominantly by FL1 thickness, and in view of the fact that Bs is a complementary result of FL1 and FL2 thickness, an experiment to determine the effect of varying FL2 thickness from 5.5 to 10 Angstroms at a fixed FL1 thickness (14.5 Angstroms) was performed. Results are listed in Table 5.

TABLE 5

Magnetic Properties of MTJs with BE/NiCr45/MnPt150/Co$_{75}$Fe$_{25}$23/Ru7.5/Co$_{20}$Fe$_{60}$B$_{20}$21/
Mg6-NOX(II)Mg3/OSL/Mg3/Co$_{20}$Fe$_{60}$B$_{20}$14.5/FeSiO$_2$10/FL2/Ru30 configuration

| FL2 layer | Bs | RA | dR/R | Rp_cov | Hc_at field (Oe) | Hc_rem (Oe) | J$_{C0}$, A/cm$^2$ | VW (mV) | VR (mV) |
|---|---|---|---|---|---|---|---|---|---|
| Co$_{20}$Fe$_{60}$B$_{20}$ 5.5 | 0.65 | 6.3 | 85 | 5 | 48 | 120 | 1.4 × 10$^6$ | 404 | 112 |
| Co$_{20}$Fe$_{60}$B$_{20}$ 7 | 0.68 | 5.8 | 86 | 4.4 | 55 | 128 | 1.5 × 10$^6$ | 396 | 116 |
| Co$_{20}$Fe$_{60}$B$_{20}$ 8.5 | 0.71 | 6.1 | 85 | 4.7 | 58 | 133 | 1.7 × 10$^6$ | 405 | 125 |
| Co$_{20}$Fe$_{60}$B$_{20}$ 10 | 0.74 | 5.9 | 87 | 4.4 | 85 | 133 | 1.9 × 10$^6$ | 433 | 148 |

In summary, results in Table 5 indicate the following: (1) for a fixed FL1 thickness, Bs as well Hc_rem can be increased by increasing FL2 thickness; (2) for a fixed FL1, RA and VW are relatively unaffected by changes in Bs; and (3) VR and J$_{C0}$ are increased as FL2 thickness becomes larger.

The thermal stability of a STT-RAM bit is critical for its viability in non-volatile memory applications. Recently, it has become customary to determine Eb for STT-RAM from an individual bit by a linear fit of the switching current versus the logarithm of the pulse width. In a free layer that includes a NCC layer, the spin current passes only through the nano-conducting channels thereby generating a great amount of Joule heating. As a result, Joule heating may significantly lower STT Eb=KuV/k$_B$T since a higher T value will lower Ku. The Eb=30 for the MTJ in Table 2 is unexpectedly low. The most straightforward way to evaluate thermal stability (Eb) for real applications is with the Sharrock method which directly gives standby (no current) thermal stability and thereby the data storage retention time. Storage Eb corresponds to remnant magnetization at ambient temperature. We have used a HDK (magnetization field decay) test to measure Eb (storage) for MTJs with various CoFeB/FeSiO$_2$/CoFeB free layer configurations and found HDK-Eb is about two to three times greater than a STT Eb value. Thus, in our examples that are fabricated according to an embodiment of the present invention, Eb measured by the more relevant HDK test is in the range of 60 to 90 and satisfies the 64 Mb STT-RAM design point.

To explore the thermally assisted effect during the write process, a series of nanomagnets with a CoFeB14/FeSiO/ CoFeB6 free layer configuration and different FeSiO thicknesses from 6 to 9 Angstroms (MagIC scale) was tested. Note that a NCC (FeSiO) layer at 8 Angstroms on the MagIC scale is equivalent to a 10 Angstrom thickness as measured by HR-TEM. In theory, as the NCC layer thickness becomes greater in the nanomagnet (MTJ), the FeSiO layer will produce more Joule heating which will assist in free layer magnetization switching.

In one experiment, MTJ stacks were formed on Arachne wafers with a composition represented by BE/NiCr45/ MnPt150/CoFe20/Ru7.5/CoFeB15/CoFe6/MgO/CoFeB14/ FeSiO(6,7,8,9)/CoFeB6/Ru30/MnPt/Ta. After the MTJ stack deposition, the wafers were annealed at 265° C. for 2 hours with a 10K Oe field. In another experiment, the MTJ stacks were formed on SiO$_2$/Si wafers (short loop). Thereafter, the annealing was performed with a 330° C., 1 hour, 10K Oe process. We found that the RA for the MTJ formed on Arachne wafers is around 14 ohm-µm$^2$ and RA for the MTJ fabricated on the Si wafers is approximately 5 ohm-µm$^2$.

Figure 9:
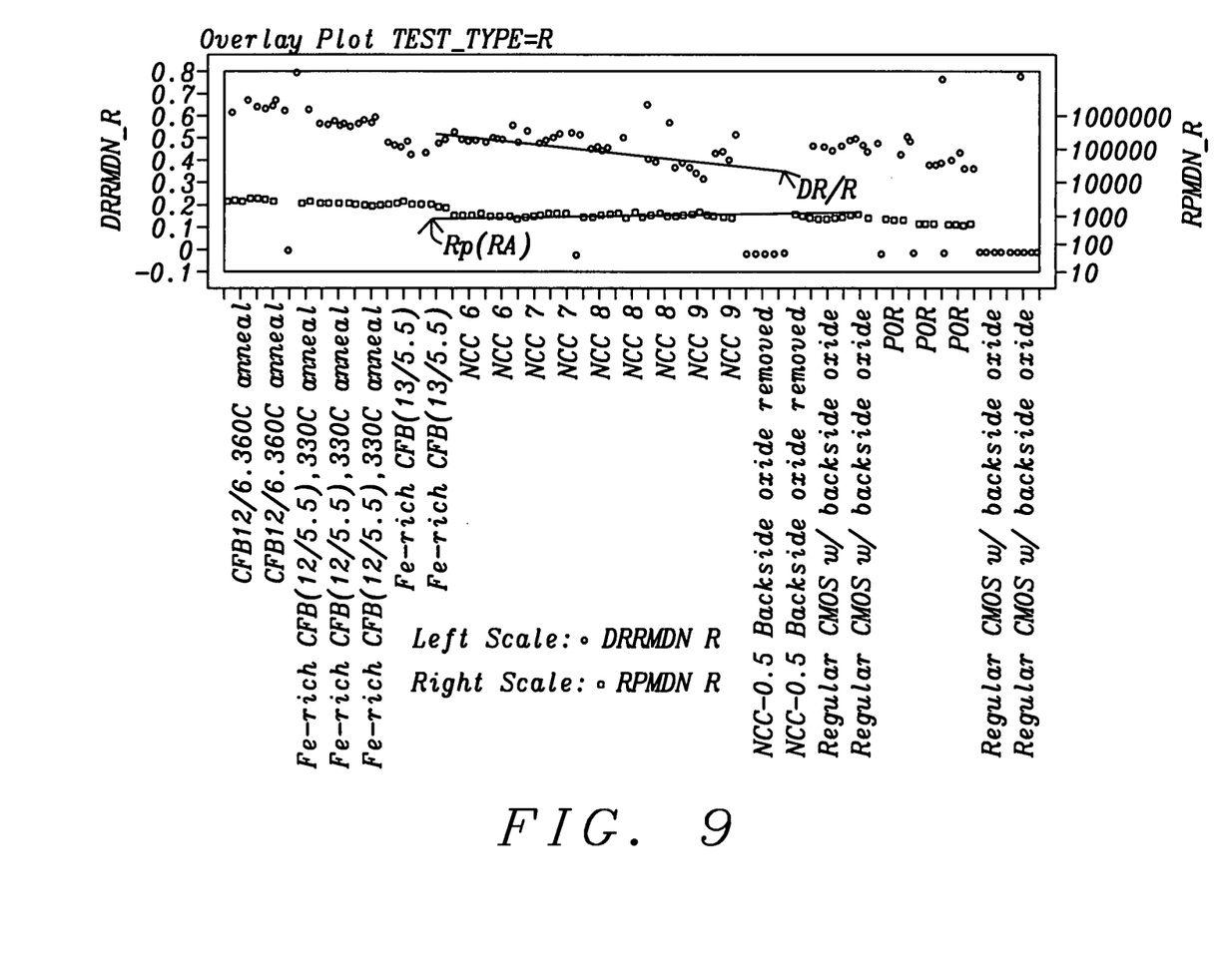
FIG. 9 is a plot that shows how DR/R decreases and RA increases as the thickness of a NCC layer is increased in a CoFeB/FeSiO/CoFeB free layer configuration.

Referring to FIG. 9, magnetic performance parameters measured on the Arachne wafers are plotted for a nanomagnet size of around 55 nm×210 nm. The plot shows that RA increases as the NCC thickness increases from 6 to 9 Angstroms. In addition, DR/R decreases as the NCC thickness increases.

Figure 10:
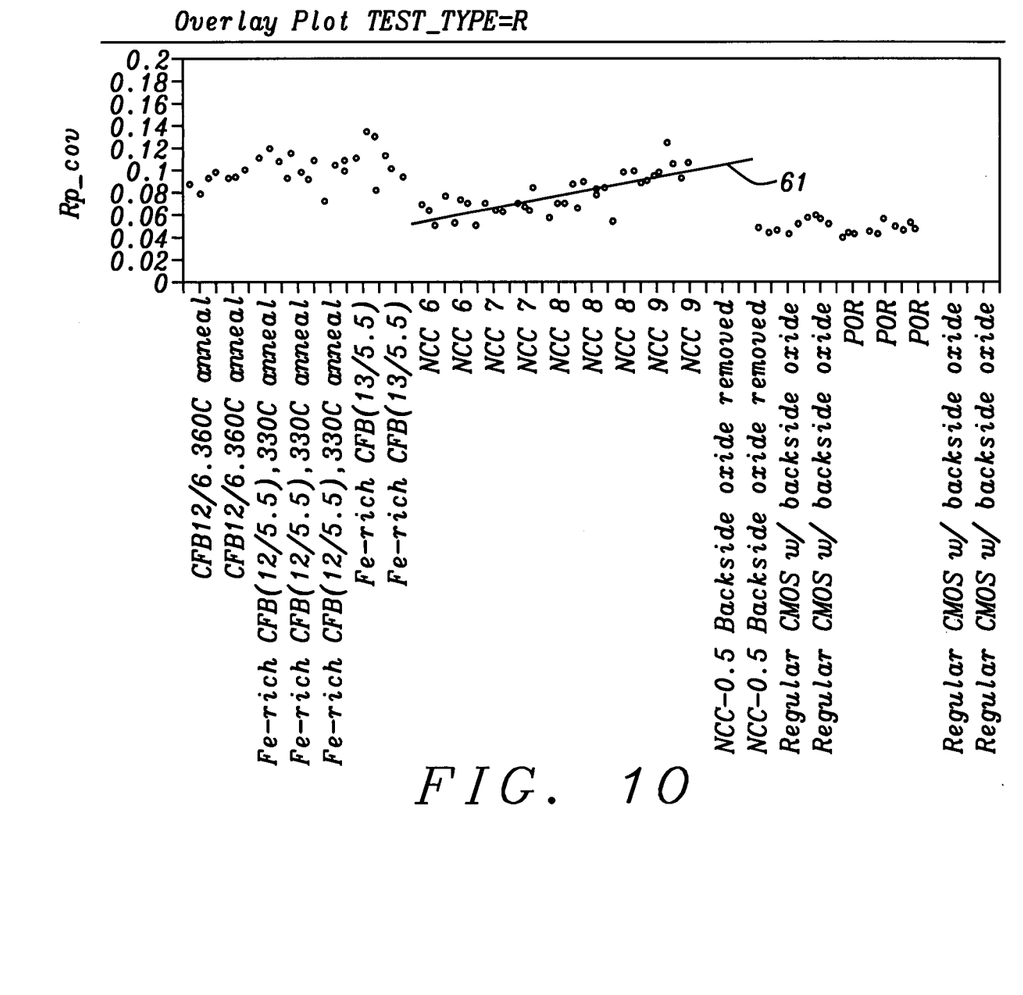
FIG. 10 is a plot that shows how Rp_cov increases with increasing thickness of a NCC layer in a CoFeB/FeSiO/CoFeB free layer configuration.

Referring to FIG. 10, the magnetic performance parameters in the aforementioned paragraph also include Rp_cov (line 61) which increased with increasing NCC thickness. This result is interpreted to mean that more nano-conducting channels are functioning in a 6 Angstrom thick FeSiO NCC layer than in a 9 Angstrom thick FeSiO NCC layer.

Figure 11:
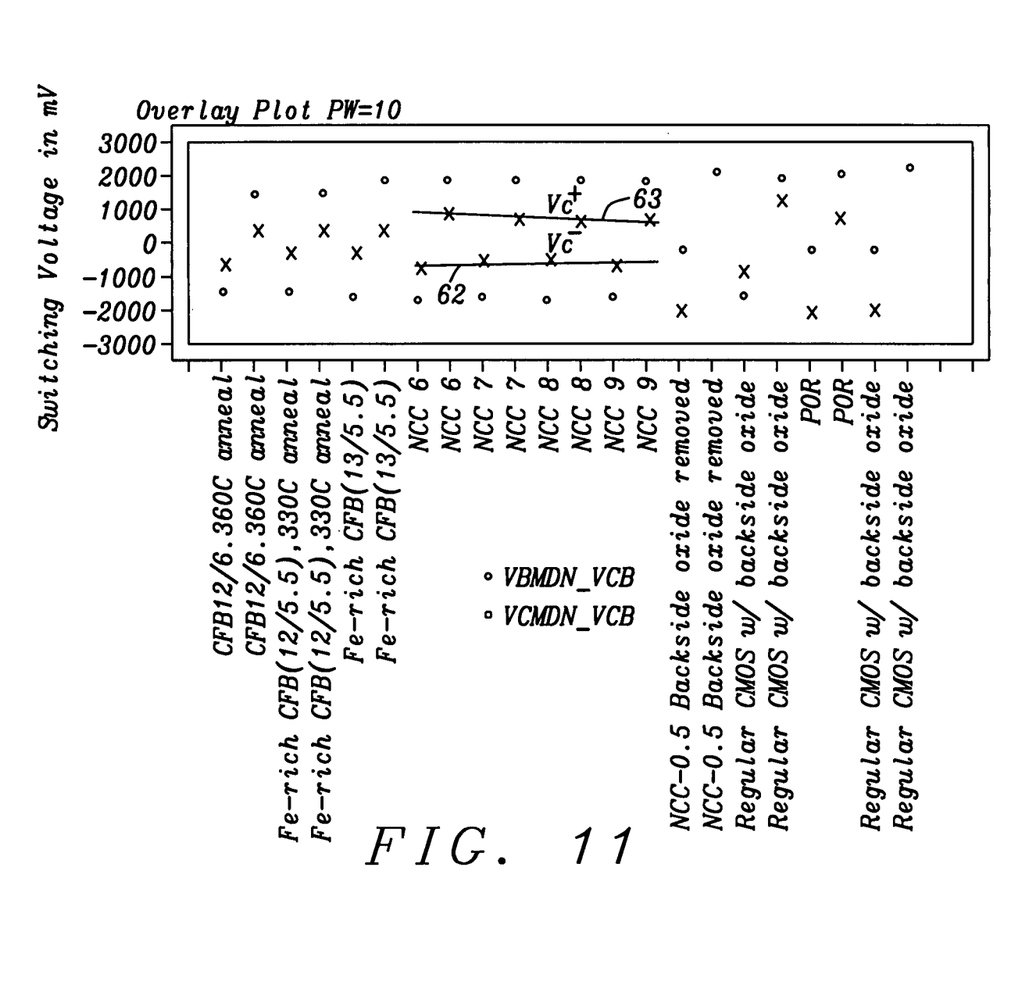
FIG. 11 is a plot that illustrates how the switching voltage Vc decreases in a nanomagnet as the thickness of a NCC layer is increased in a CoFeB/FeSiO/CoFeB free layer configuration.

With regard to FIG. 11, Vc is the switching voltage and Vb (Vbd) is the breakdown voltage of the MgO tunnel barrier layer in the aforementioned experiments. Vc$^+$ (line 63) is for P (parallel) to AP (anti-parallel) switching and Vc$^-$ (line 62) is for AP to P switching. The pulse width is 100 ns and the free layers (FL1, FL2) have a Co$_{40}$Fe$_{40}$B$_{20}$ composition. Note that Vc decreases as NCC layer thickness increases from 6 Angstroms (NCC6) to 9 Angstroms (NCC9) in this MTJ formed on an Arachne wafer where RA is around 14 ohm-µm$^2$. The y-axis is the switching voltage in mV units.

As mentioned earlier, the real thickness as measured by HR-TEM is 10 Angstroms for a NCC thickness of 8 Angstroms on the MagIC scale as reported for thickness values in the experiments and descriptions found herein. In summary, we find a higher dR/R and lower (better) Rp_cov for MTJs made with a thinner NCC layer. However, Vc (Jc) is reduced when NCC thickness becomes larger which means we can conclude that Vc (Jc) reduction for a CoFeB/NCC/CoFeB MTJ in comparison to a CoFeB only MTJ is due to writing with a "thermally assisted" mode.

To summarize the comparison of an MTJ with a single NCC layer as described in the first embodiment with an MTJ having a dual NCC layer as in an alternative embodiment of the present invention, the magnetic properties for the optimum configurations of each are shown in Table 6. Nanomagnet size is 55 nm×210 nm (oval) in Table 6 for both single NCC and dual NCC structures. The top row has a single NCC free layer configuration and the bottom row has a dual NCC free layer structure. Although $J_{CO}$ of the dual NCC MTJ is larger, Bs and Hc_rem is also greater than for a single NCC MTJ. Thus, we find that for a smaller MTJ having a 55 nm×150 nm size, for example, in a high density STT-RAM, the dual NCC MTJ is more viable. Moreover, as nanomagnet (MTJ) size is further reduced in more advanced designs, $J_{CO}$ will decrease as well.

TABLE 6

Magnetic Properties of MTJs with BE/NiCr45/MnPt150/Co$_{75}$Fe$_{25}$23/Ru7.5/Co$_{20}$Fe$_{60}$B$_{20}$21/ Mg6-NOX(II)Mg3/OSL/Mg3/NCC free layer/Ru30/Ta/HM configuration

| NCC = FeSiO free layer configuration | Bs | RA | dR/R | Rp_cov | Hc_rem (Oe) | $J_{CO}$, A/cm$^2$ | VW (mV) | VR (mV) |
|---|---|---|---|---|---|---|---|---|
| Co$_{20}$Fe$_{60}$B$_{20}$15.5-NCC10-Co$_{20}$Fe$_{60}$B$_{20}$10 | 0.70 | 6.8 | 83 | 4.1 | 133 | 1.2 × 10$^6$ | 380 | 134 |
| Co$_{20}$Fe$_{60}$B$_{20}$15.5-NCC7-Co$_{20}$Fe$_{60}$B$_{20}$4.5-NCC7-Co$_{20}$Fe$_{60}$B$_{20}$10 | 0.78 | 7.5 | 78 | 4.5 | 160 | 1.8 × 10$^6$ | 433 | 200 |

We have demonstrated an overall improvement compared with prior art MTJs for STT-RAM devices by simultaneously achieving the required performance targets for Hc, VW, VR, and Eb(storage). Furthermore, (dR/R)/Rp_cov is around 20 and our $J_{CO}$=1.2×10$^6$ A/cm$^2$ result in a single NCC free layer structure may be the lowest value reported to date. These performance enhancements are realized primarily by implementing an improved MgO tunnel barrier layer including an OSL layer as described earlier and by utilizing a CoFeB composition that is lower in Co content and higher in Fe content than previously employed. It is important that the CoFeB layers are deposited by a low pressure and low power sputter deposition method as described earlier. Another advantage of the present invention is a lower SBD percent that indicates a more uniform MgO tunnel barrier is produced by the MgO method of an embodiment described herein. Although the improvements highlighted above are currently directed towards enabling a 64 Mb STT-RAM technology, it is conceivable that the MTJ structure modifications disclosed in the various embodiments of the present invention will also be useful in advancing device development based on 65 nm and 45 nm technology nodes anticipated for 256 Mb STT-RAM and higher areal density devices.

While this invention has been particularly shown and described with reference to, the preferred embodiment thereof, it will be understood by those skilled in the art that various changes in form and details may be made without departing from the spirit and scope of this invention.

We claim:

1. A MTJ nanopillar structure formed on a bottom electrode in a STT-RAM device, comprising:
    (a) a synthetic anti-ferromagnetic (SyAF) pinned layer with an AP2/coupling/AP1 configuration;
    (b) a MgO tunnel barrier that includes an oxygen surfactant layer, said MgO tunnel barrier contacts the AP1 layer; and
    (c) a composite free layer including at least one NCC layer formed between [Co$_x$Fe$_{(1-X)}$]$_{80}$B$_{20}$ layers where x is between 10 and 30, and wherein NCC is a nanocurrent channel layer comprised of R(M) grains that are formed in a metal (M) oxide, nitride, or oxynitride insulator matrix, wherein R is Fe, Ni, or Co, or a combination thereof, and M is a metal, the at least one NCC layer has a thickness less than or equal to a R(M) grain diameter of 10 Angstroms.

2. The MTJ nanopillar structure of claim 1 wherein the composite free layer has a FL1/NCC/FL2 configuration wherein said FL1 layer is a lower [Co$_x$Fe$_{(1-X)}$]$_{80}$B$_{20}$ magnetic layer contacting the MgO tunnel barrier and has a greater thickness than the FL2 layer, and the FL2 layer is an upper [Co$_x$Fe$_{(1-X)}$]$_{80}$B$_{20}$ magnetic layer contacting a capping layer.

3. The MTJ nanopillar structure of claim 2 wherein the insulator matrix is silicon oxide, R is Fe and M is Si, and the NCC layer is FeSiO.

4. The MTJ nanopillar structure of claim 2 wherein the AP1 layer has a [Co$_x$Fe$_{(100-X)}$]$_{80}$B$_{20}$ composition where x is from about 20 to 30, or is comprised of CoFe, or a combination of CoFeB and CoFe.

5. The MTJ nanopillar structure of claim 2 wherein the capping layer has a NCC/Ru configuration, the NCC thickness in the capping layer is from about 5 to 6 Angstroms, and the NCC layer in the composite free layer has a thickness of about 6 to 7 Angstroms.

6. The MTJ nanopillar structure of claim 2 wherein the FL1 layer in the composite free layer has a thickness from about 13 to 17 Angstroms and the FL2 layer in the composite free layer has a thickness between about 6 and 12 Angstroms.

7. The MTJ nanopillar structure of claim 1 wherein the composite free layer has a FL1/NCC1/FL2/NCC2/FL3 configuration wherein each of the FL1, FL2, FL3 layers comprises [Co$_x$Fe$_{(1-X)}$]$_{80}$B$_{20}$, said FL1 layer is a lower magnetic layer contacting the MgO tunnel barrier, the FL2 layer is a middle magnetic layer, the FL3 layer is an upper magnetic layer contacting a capping layer, and the NCC1 and NCC2 layers are nano-conducting channel (NCC) layers.

8. The MTJ nanopillar structure of claim 7 wherein the AP1 layer has a [Co$_x$Fe$_{(100-X)}$]$_{80}$B$_{20}$ composition where x is from about 20 to 30, or is comprised of CoFe, or a combination of CoFeB and CoFe.

9. The MTJ nanopillar structure of claim 1 wherein the insulator matrix is aluminum oxide, R is Fe, Co or CoFe, and M is Al.

10. The MTJ nanopillar structure of claim 1 further comprised of a capping layer that contacts a top surface of the composite free layer, the capping layer is made of Ru or has a NCC/Ru composition.

11. A MTJ nanopillar structure formed on a bottom electrode in a STT-RAM device, comprising:
    (a) a seed layer formed on the bottom electrode;
    (b) an anti-ferromagnetic (AFM) layer formed on the seed layer;
    (c) a synthetic anti-ferromagnetic (SyAF) pinned layer with an AP2/coupling/AP1 configuration formed on the AFM layer wherein the AP2 layer contacts the AFM layer;
    (d) a MgO tunnel barrier that comprises an oxygen surfactant layer formed on the AP1 layer;

(e) a composite free layer with a FL1/NCC1/FL2/NCC2/FL3 configuration wherein each of FL1, FL2, and FL3 are comprised of $[Co_xFe_{(1-x)}]_{80}B_{20}$ where x is between 10 and 30, and NCC1 and NCC2 are nano-conducing channel layers comprised of R(M) grains that are formed in a metal (M) oxide, nitride, or oxynitride insulator matrix, R is Fe, Ni, or Co, or a combination thereof and M is a metal, said FL1 layer contacts the MgO layer and has a greater thickness than the FL2 and FL3 layers, the NCC1 and NCC2 layers have a thickness less than or equal to a R(M) grain diameter of 10 Angstroms; and (f) a capping layer formed on the composite free layer.

12. The MTJ nanopillar structure of claim 11 wherein the insulator matrix is silicon oxide, R is Fe and M is Si, and a thickness of the FeSiO NCC layer in the composite free layer is about 8 to 10 Angstroms.

13. The MTJ nanopillar structure of claim 11 wherein the insulator matrix is aluminum oxide, R is Fe, Co or CoFe, and M is Al.

14. The MTJ nanopillar structure of claim 11 wherein the AP1 layer has a $[Co_xFe_{(100-x)}]_{80}B_{20}$ composition where x is from about 20 to 30, or is comprised of CoFe, or a combination of CoFe and CoFeB.

15. The MTJ nanopillar structure of claim 11 wherein the FL1 layer in the composite free layer has a thickness from about 13 to 20 Angstroms, the FL2 layer in the composite free layer has a thickness between about 4 and 5 Angstroms, and the FL3 layer has a thickness from about 4 to 12 Angstroms.

16. The MTJ nanopillar structure of claim 11 further comprised of a hard mask formed on the capping layer.

\* \* \* \* \*